(12) United States Patent
Dertinger et al.

(10) Patent No.: US 8,048,801 B2
(45) Date of Patent: Nov. 1, 2011

(54) SUBSTRATE WITH FEEDTHROUGH AND METHOD FOR PRODUCING THE SAME

(75) Inventors: Stephan Dertinger, München (DE);
Alfred Martin, München (DE);
Barbara Hasler, München (DE); Grit Sommer, Grafing bei München (DE);
Florian Binder, Buchendorf (DE)

(73) Assignees: Infineon Technologies, AG, Neubiberg (DE); Qimonda AG, Munich (DE)

( * ) Notice: Subject to any disclaimer, the term of this patent is extended or adjusted under 35 U.S.C. 154(b) by 1147 days.

(21) Appl. No.: 11/751,396

(22) Filed: May 21, 2007

(65) Prior Publication Data

US 2008/0268638 A1    Oct. 30, 2008

(30) Foreign Application Priority Data

Apr. 25, 2007  (DE) .................. 10 2007 019 552

(51) Int. Cl.
*H01L 21/44* (2006.01)
(52) U.S. Cl. .................. 438/667; 257/E21.597
(58) Field of Classification Search .............. 438/667; 257/E21.597

See application file for complete search history.

(56) References Cited

U.S. PATENT DOCUMENTS

| | | | |
|---|---|---|---|
| 4,874,484 A | 10/1989 | Foell et al. | |
| 6,110,825 A | 8/2000 | Mastromatteo et al. | |
| 6,518,752 B1 | 2/2003 | Wyss | |
| 6,581,280 B2 * | 6/2003 | Curcio et al. | 29/832 |
| 6,667,551 B2 * | 12/2003 | Hanaoka et al. | 257/E21.597 |
| 6,784,102 B2 * | 8/2004 | Yeung et al. | 438/667 |
| 6,982,141 B2 * | 1/2006 | Nogome et al. | 257/E21.597 |
| 7,174,223 B2 * | 2/2007 | Dalton et al. | 607/137 |
| 7,176,128 B2 | 2/2007 | Ahrens et al. | |
| 7,279,776 B2 * | 10/2007 | Morimoto | 257/E21.597 |
| 7,528,491 B2 * | 5/2009 | Kirby et al. | 257/E21.597 |
| 7,538,032 B2 * | 5/2009 | Borwick et al. | 438/667 |
| 7,749,899 B2 * | 7/2010 | Clark et al. | 438/667 |
| 2004/0187975 A1 * | 9/2004 | Suemasu et al. | 148/522 |
| 2005/0127478 A1 * | 6/2005 | Hiatt et al. | 257/621 |
| 2005/0189637 A1 | 9/2005 | Okayama et al. | |
| 2005/0266687 A1 | 12/2005 | Morimoto | |
| 2006/0131691 A1 * | 6/2006 | Roozeboom et al. | 257/534 |
| 2008/0003817 A1 | 1/2008 | Morimoto | |

FOREIGN PATENT DOCUMENTS

| | | |
|---|---|---|
| CN | 1816246 | 8/2006 |
| WO | 2003089925 A2 | 10/2003 |
| WO | 2005088699 A1 | 9/2005 |
| WO | 2007025812 A1 | 3/2007 |

OTHER PUBLICATIONS

Sven Matthias & Frank Muller, "Asymmetric Pores in a Silicon Membrane Acting As Massively Parallel Brownian Ratchets," Nature Publishing Group, 2003, pp. 53 to 57. Kazuhisa Itoi et al., "Through-Hole Interncconnections for SI Interposers," 14th European Microelectronics and Packaging Conference & Exhibition, Jun. 23-25, 2003, pp. 37 to 41.
Satoshi Yamamoto et al., "Si Through-Hole Interconnections Filled With Au-Sn Solder by Molten Metal Suction Method," IEEE 2003, pp. 642-645.
First Office Action in counterpart Chinese Application No. 200810089172.5, dated Jul. 24, 2009.

* cited by examiner

*Primary Examiner* — Matthew Landau
*Assistant Examiner* — Sun M Kim
(74) *Attorney, Agent, or Firm* — Edell, Shapiro & Finnan, LLC

(57) ABSTRACT

A substrate with first and second main surfaces includes at least one channel extending from the first main surface to the second main surface. The at least one channel includes a first cross-sectional area at a first location and a second cross-sectional area at a second location. An electrically conductive first material is disposed in the at least one channel.

24 Claims, 12 Drawing Sheets

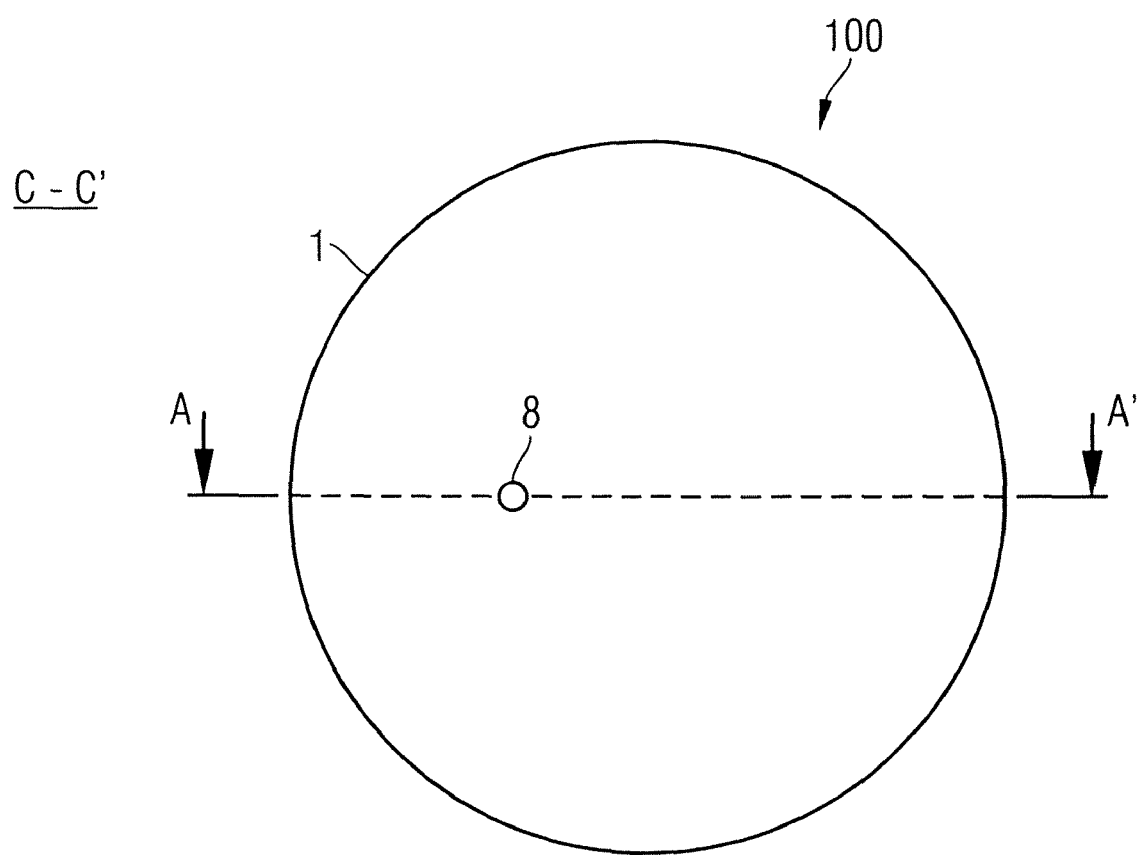

US 8,048,801 B2

SUBSTRATE WITH FEEDTHROUGH AND METHOD FOR PRODUCING THE SAME

CROSS REFERENCE TO RELATED APPLICATIONS

This application claims priority under 35 U.S.C. §119 to Application No. DE 102007019552.6 filed on Apr. 25, 2007, entitled "Substrate with Feedthrough and Method for Producing the Same," the entire contents of which are hereby incorporated by reference.

BACKGROUND

Integrated circuits, sensors or micromechanical apparatus are usually applied on a substrate or integrated into such a substrate. In order to be able externally to connect integrated circuits, it may be useful for the substrates to be provided with electrically conductive feedthroughs from the substrate top side to the substrate underside.

SUMMARY

Described herein is a substrate comprising a semiconductor substrate with a first main surface, a second main surface and comprising at least one channel extending from the first main surface to the second main surface. The at least one channel comprises a first cross-sectional area at a first location and a second cross-sectional area at a second location. An electrically conductive first material is introduced into the at least one channel.

Furthermore, a semiconductor module is provided comprising a substrate and an integrated circuit. The substrate is formed like the substrate described above. The integrated circuit is applied to the substrate.

Furthermore, a method is specified in which a semiconductor substrate with a first main surface, a second main surface, and at least one channel extending from the first main surface to the second main surface is provided. The at least one channel includes a first cross-sectional area at a first location and a second cross-sectional area at a second location. An electrically conductive first material is filled into the at least one channel.

The above and still further features of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

A number of exemplary embodiments are described below, the features of which embodiments merely serve for illustrating the invention and are not intended to limit the latter in any way.

FIGS. 1A to 1C schematically show a substrate 100 and a method for producing the substrate 100.

DETAILED DESCRIPTION

Figure 1A:
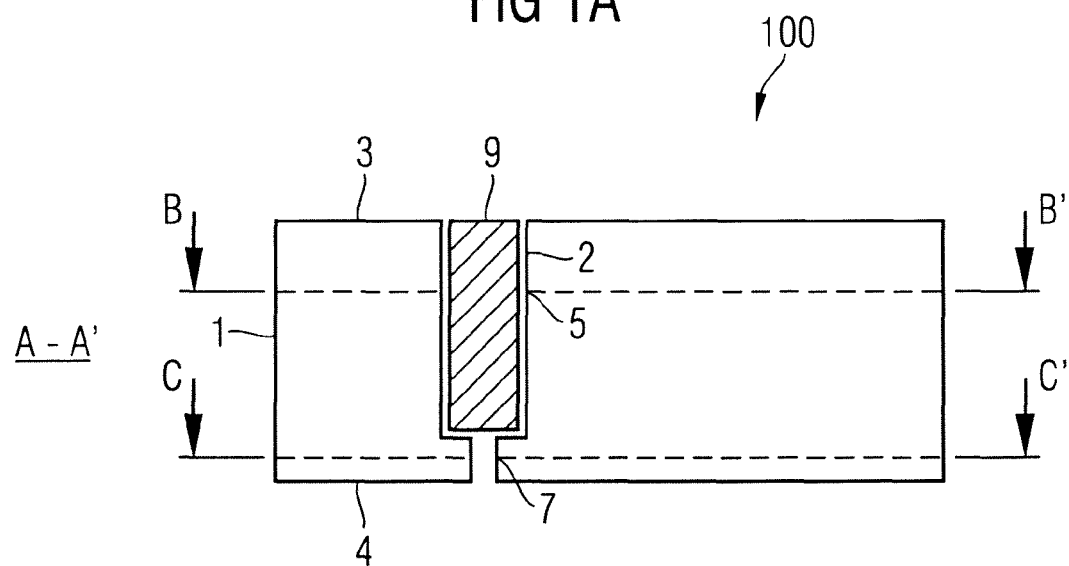

A description is given below of substrates and also methods for producing the substrates. The substrates may serve as carriers in order that devices patterned on the micron scale or nanometer scale, e.g., integrated electrical or electro-optical circuits, sensors or micromechanical apparatus, are held in position and/or externally connected. The substrates may contain semiconductor substrates, in particular silicon substrates, germanium substrates, GaAs substrates, SiC substrates, fully or partially oxidized macroporous silicon, etc. Due to good pattern ability and the electronic properties inherent to semiconductors, the semiconductor substrates may serve both as carriers and components including integrated active component elements, e.g., transistors, diodes, movable structure elements, sensor elements, etc. On account of the highly developed semiconductor process technology, the active component elements can be integrated into a semiconductor substrate with a very high density.

If the semiconductor substrates are used as carriers, they can receive one or a plurality of further semiconductor substrates (i.e., "chips") which themselves may serve as carriers and/or into which are integrated active component elements. The chips may be adhesively bonded or soldered onto the carrier substrate, or may be fixed in a similar manner. The electrically conductive contacts between the chips or between the chips and external connections may be produced, if appropriate, via bonding wires, flip-chip bonding or additionally applied interconnects. In this way, a semiconductor substrate can be used as a carrier for producing compact, highly integrated "system in package" (SiP) modules. These modules may be used in the area of communications technology and also automotive, industrial and consumer electronics (e.g., radio-frequency module for mobile telephones, base station or else radar modules for automobiles).

The use of silicon as substrate carrier has the further advantage that most of the integrated components are likewise integrated into silicon. In this case, a substrate carrier made of silicon would have the same coefficient of thermal expansion (CTE) as the components mounted to it. This reduces the destructive mechanical forces that may form between carrier and component on account of thermal cycles during operation. Due to the good pattern ability of semiconductors and the highly developed semiconductor technology, the channels in the semiconductor substrates can have particularly small cross-sectional areas. As a result, it is possible to produce a channel density on the substrate surface which corresponds to the feature sizes of an integrated semiconductor component, e.g., a few hundred nm.

For high system integration, it is useful for the substrate to have electrically conductive feedthroughs from one main surface to the other main surface of the substrate. Interconnects on both sides of the substrate can thus be electrically conductively connected to one another. In this way, it is possible to produce short electronic connections between electronic component elements and components which are arranged on opposite main surfaces of the substrate. As a result, a predetermined substrate surface can be utilized economically, package sizes can be minimized and the outlay for additional interconnect planes can be avoided.

For example, it is possible to produce direct connections between an integrated component flip-chip-mounted on one main surface of the semiconductor substrate and contact elements arranged on the other main surface of the substrate. If the positions of the electrically conductive feedthroughs are orientated to the positions of the chip contacts, the feedthroughs can provide for short connections to the contact elements in order that, for example, fast signals (e.g., RF signals) are passed outwards as far as possible in a manner free of interference and free of delay.

If a substrate is provided with an integrated circuit on a front side and electrically conductive feedthroughs are furthermore present, the latter can be used to pass signals of the integrated component directly to the rear side of the substrate. In this way, particularly short electrical connections between the integrated circuit and external connections can be produced with the aid of contact elements soldered onto the electrically conductive feedthroughs. The contact elements on the rear side additionally permit a stack construction in which integrated components can be stacked one above another and be directly contact-connected.

The electrically conductive feedthroughs are introduced into channels through the semiconductor substrate. The channels in each case extend from a first main surface of the semiconductor substrate to a second main surface of the semiconductor substrate. The first and second main surfaces are usually the two large opposite areas of the semiconductor substrate. In particular, the main surfaces are the two surfaces of a round monocrystalline semiconductor wafer or the sawn parts (i.e., "chips") thereof. The areas of a semiconductor wafer are generally standardized according to predetermined wafer diameters (e.g., 4 inches, 8 inches, 10 inches, and 12 inches (300 mm)). The thickness of the wafers may vary within ranges of typically 100-1000 μm, where these values may also be smaller or larger in specific applications.

The at least one or the multiple channels in each case have a first opening on the first main surface and a second opening on the second main surface of the semiconductor substrate. If the two openings lay one above the other, then the channel can connect the first opening to the second opening in a direction largely perpendicular to the first or second main surface. In this case, the channel length essentially corresponds to the thickness of the semiconductor substrate.

An electrically conductive first material and in particular an electrically conductive second material are introduced into the at least one channel. The electrically conductive first and second materials and also possibly further electrically conductive materials form the electrically conductive feedthrough through the at least one channel. The electrically conductive materials may be for example metals, (e.g., copper, silver or gold or alloys) or else hard solders, (e.g., based on silver (e.g., AgCu28)), soft solders, (e.g., based on tin, etc). The choice of the electrically conductive materials can be adapted to the desired requirements or areas of use of the substrate.

The at least one channel through the semiconductor substrate has a first cross-sectional area at a first location and a second cross-sectional area at a second location. The first and the second cross-sectional area differ in magnitude. Furthermore, the at least one channel can have the first or second cross-sectional area at further locations. For example, the first cross-sectional area can be present within a first section and the second cross-sectional area within a second section. Furthermore, it is also possible for the at least one channel to have a third cross-sectional area, which differs from the first and/or second cross-sectional area, at a third location or in a third section. In a corresponding manner, the at least one channel can also have other cross-sectional areas at further locations. Depending on the production method by which the at least one channel is produced in the semiconductor substrate, more or less sharp transitions between different cross-sectional areas can arise.

The cross-sectional areas of the at least one channel may be formed for example essentially in circular fashion, but may also assume other geometrical forms. In the case of circular cross-sectional areas, the first and second cross-sectional areas have different diameters. Depending on the application and substrate material, the cross-sectional areas may assume values of between a few 100 square nanometers through to a few square millimeters. Larger or smaller values cannot be ruled out, however. The size of the cross-sectional areas may depend on how much current is intended to flow through the electrically conductive feedthrough, whether the electrically conductive feedthrough is also intended to serve for the thermal dissipation of the heat from, for example, heat-generating integrated circuits, whether certain induction or capacitance requirements are intended to be met, etc. Finally, the cross-sectional area also depends on how many feedthroughs and the density of the feedthroughs that are intended to be produced.

Exemplary embodiments which are illustrated schematically and in no way true to scale in the accompanying figures will now be described in detail below in connection with the figures.

Figure 1B:
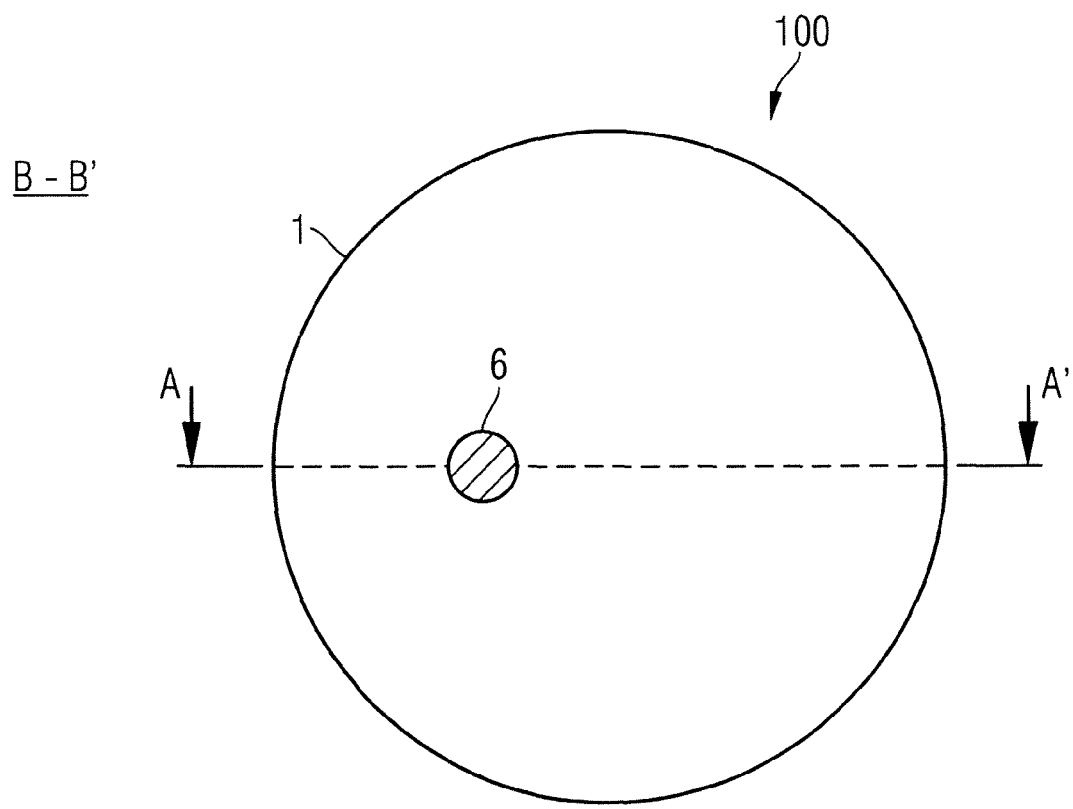

FIGS. 1A, 1B and 1C show sections A-A', B-B' and C-C', respectively, through a substrate 100. The sections B-B' and C-C' run parallel to one another and run perpendicular to the section A-A'. The substrate 100 comprises, for example, a circular semiconductor substrate 1, into which at least one channel 2 has been introduced. The channel 2 extends from a first main surface 3 to a second main surface 4 of the semiconductor substrate 1. The channel 2 has a first cross-sectional area 6 at a first location 5, through which the section B-B' extends, and the channel 2 has a second cross-sectional area 8 at a second location 7, through which the section C-C' extends. For example, the second cross-sectional area 8 is smaller than the first cross-sectional area 6. An electrically conductive first material 9 is introduced into the channel 2.

Further substrates 200 to 600 and the production methods thereof are described below with reference to FIGS. 2 to 6. The substrates 200 to 600 represent developments of the substrate 100 shown in FIG. 1. The below-described configurations of the substrates 200 to 600 and the production methods thereof can be applied in a corresponding manner to the substrate 100.

Figure 2A:
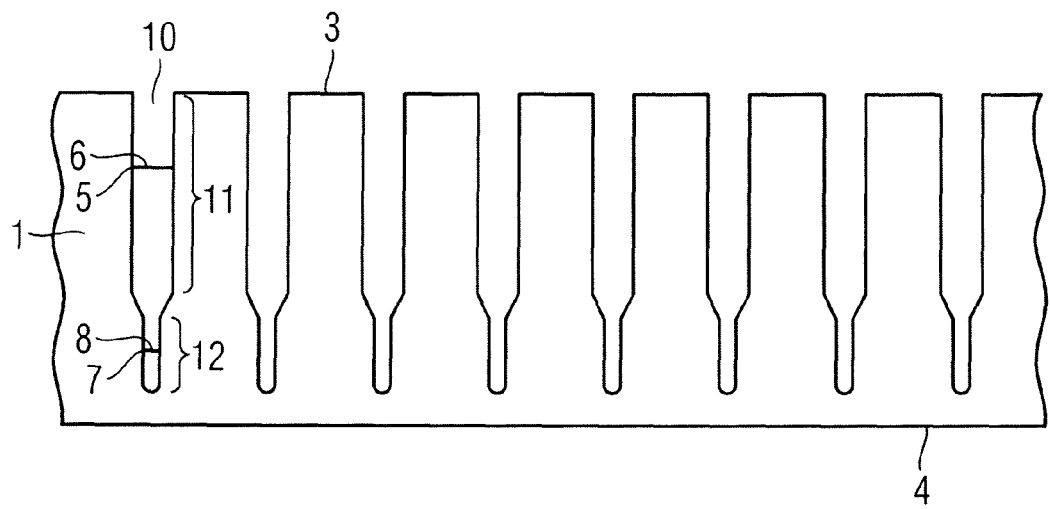
FIGS. 2A to 2E schematically show a substrate 200 and a method for producing the substrate 200.
Figure 2B:
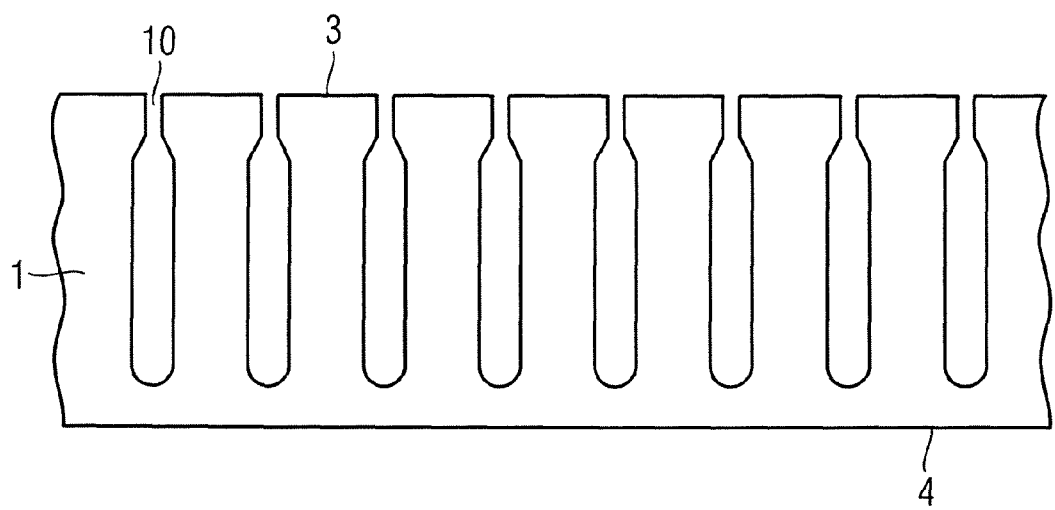
Figure 2C:
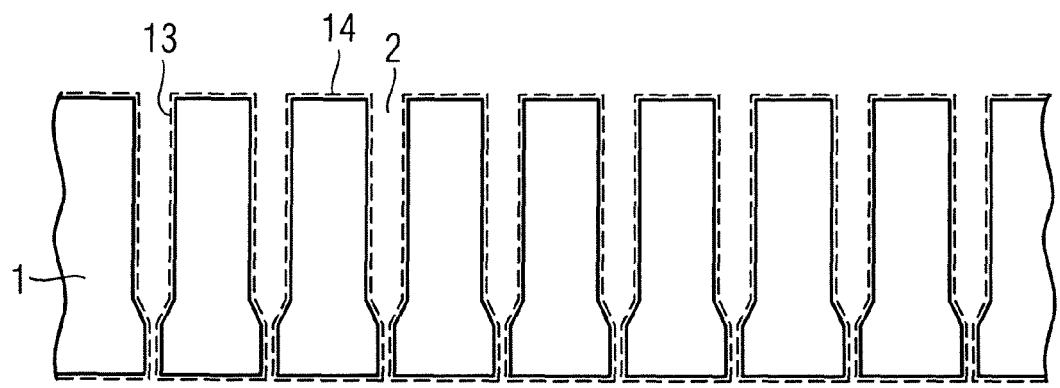
Figure 2D:
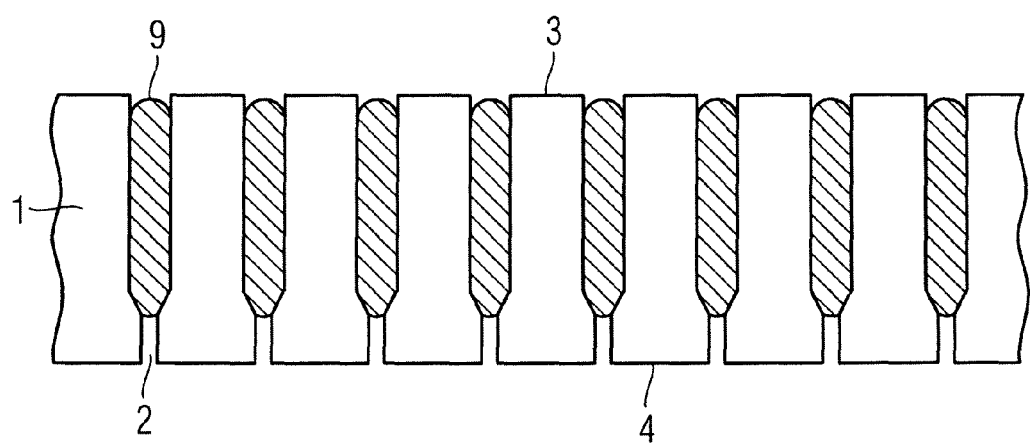
Figure 2E:
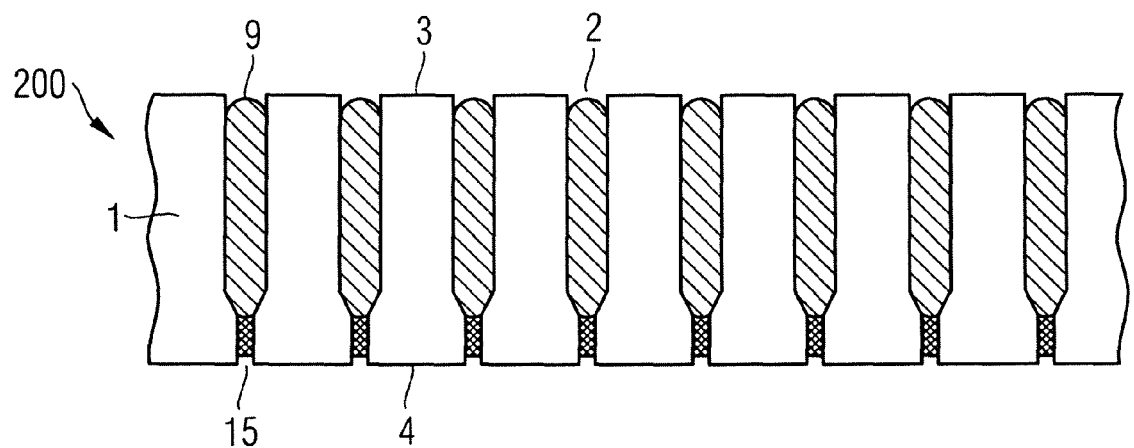

FIG. 2E schematically illustrates the substrate 200 containing a plurality of channels 2. FIGS. 2A to 2E show steps for producing the substrate 200.

In order to produce the substrate 200, first the semiconductor substrate 1 is provided, into which blind holes 10 are produced at the locations at which later the channels 2 are intended to extend through the semiconductor substrate 1. The production of the blind holes 10 can be effected in many different ways. For example, electrochemical etching constitutes one possible production variant. In order to prepare for the electrochemical etching, the first main surface 3 of the semiconductor substrate 1 is incipiently etched selectively with respect to a mask using, e.g., 10% strength potassium hydroxide solution for, e.g., 10 minutes. Afterwards, the first main surface 3 is covered with an electrolyte, e.g., HF acid, and a voltage is applied between the second main surface 4 and the electrolyte. The second main surface 04 is simultaneously irradiated via a light source, e.g., with a wavelength of 800 nm. The intensity of the light source is set such that a predetermined current density, e.g., 10 nA per blind hole, flows between the semiconductor substrate 1 and the electrolyte. As a result of the current between the incipiently etched first main surface 3 of the semiconductor substrate 1 and the electrolyte, pores form at the incipiently etched locations and grow into the semiconductor substrate 1, thereby forming the blind holes 10.

The electrochemical etching can be carried out on p-doped or on n-doped semiconductor substrates 1, in particular silicon semiconductor substrates, the resistivity thereof typically lying within a range of 1 to 2000 ohm-cm, and optionally, within the range of 800 to 1200 ohm-cm. The form, diameter, depth and density of the blind holes 10 produced depend greatly on the current density, doping, acid strength and etching time and accordingly have to be determined anew for each new application. Electrochemical etching opens up the possibility of varying the cross-sectional areas within the individual blind holes 10 by changing etching parameters during the etching operation. For example, in the blind holes 10, a cross-sectional area formed is all the larger, the greater the etching current. In particular, there is a quadratic dependence between the etching current and the cross-sectional area produced by the electrochemical etching. Thus, for example, during the etching of a first section 11 of the blind holes 10 as shown in FIG. 2A, a greater etching current was set than for the etching of a second section 12. As a result, a larger cross-sectional area than in the second section 12 formed in the first section 11. The first section 11 contains the first location 5 and the second section 12 contains the second location 7 of the channels 2.

FIG. 2B shows, as an alternative to FIG. 2A, that the etching current can also be set such that the blind holes 10 are initially produced with a small diameter and, after a certain time, the etching current is set such that the blind holes 10 are widened.

In order to obtain from the blind holes 10 in each case a complete channel 2 from the first main surface 3 to the second main surface 4, the blind holes 10 can be etched further in a further etching step, e.g., via a dry- or wet-chemical etching method, until they reach the second main surface 4 of the semiconductor substrate 1. Alternatively, the blind holes 10 can be opened by material removal from the second main surface 4. For example, the second main surface 4 can be opened by planarization via chemical-mechanical polishing (CMP).

Instead of the electrochemical etching described above, other etching techniques can also be employed for the production of the blind holes 10 and the channels 2. In principle, the etching methods known in micromechanics, such as, for example, RIE (reactive ion etching) methods, laser drilling, sandblasting or ultrasonic drilling, can be used for this purpose as long as these etching methods allow the cross-sectional area of the channels 2 to be varied depending on the depth. Further methods for producing the blind holes 10 and channels 2 are presented further below in connection with the description of FIGS. 4 to 6.

The channels 2 extending completely through the semiconductor substrate 1 are illustrated in FIG. 2C. The semiconductor substrate 1 may have a thickness within the range of 25 to 2000 µm, and optionally, within the range of 100 to 250 µm. The channels 2 may have a diameter within the range of 2 to 150 µm, and optionally within the range of 10 to 30 µm. The ratio of channel length to channel diameter (aspect ratio) may lie within a range of 2 to 1000, and optionally relatively large aspect ratios above, e.g., 100, may be present.

In order to electrically insulate the feedthroughs of adjacent channels 2 from one another, the surfaces of the channels 2 can be provided with a first insulation layer 13, which is represented by a thicker line in FIG. 2C. The first insulation layer 13 may be an oxide layer and/or a nitride layer. If the semiconductor substrate 1 is fabricated from silicon, the first insulation layer 13 may be, e.g., an $SiO_2$ layer which, for example, is produced from TEOS (tetraethylorthosilicate) via a CVD (chemical vapor deposition) process or is sputtered, or an $Si_3N_4$ layer produced from silane ($SiH_4$) and ammonia ($NH_3$). The first insulation layer 13 may also be a combination of different insulation layers, e.g., an ONO layer, which is a combination of the abovementioned oxide-nitride-oxide layers.

Furthermore, the insulation layer 13 may be a thermally produced $SiO_2$ layer. The $SiO_2$ layer is not deposited during the thermal oxidation, rather the silicon that is already uncovered on the silicon surface is converted into silicon dioxide by heating (e.g., approximately 900 to 1200° C.) and supplying oxygen. In contrast to silicon dioxide produced in some other way, thermally produced silicon dioxide forms a highly defect-free interface with the silicon lattice. This reduces leakage currents in the silicon at the $Si/SiO_2$ interface. The parasitic capacitance between the electrically conductive materials that are to be introduced later into the channels 2 and the silicon is furthermore minimized. Minimal parasitic capacitances are important particularly for radio-frequency applications.

The thickness of the first insulation layer 13 lies within the range of 5 to 1000 nm, and optionally between 100 and 200 nm, depending on the application.

Optionally, not just the surface in the channels 2 but the entire surface of the semiconductor substrate 1, i.e., in the channels 2 and on the two main surfaces 3 and 4 of the semiconductor substrate 1, is provided with the first insulation layer 13. In the case of a silicon substrate 1, this can be effected in a single step, e.g., via a thermal oxidation or a nitriding of the silicon substrate 1 provided with the channels 2. This is an economical procedure for electrically insulating the semiconductor substrate 1 both in the channels 2 and at the main surfaces 3 and 4 from the conductive materials to be introduced later into the channels 2. In particular, the first insulation layer 13 is applied in such a way that the layer thickness of the first insulation layer 13 in the channels 2 deviates from the layer thickness on the first or second main surface 3, 4 by less than 50%, and optionally by less than 20%.

If the first insulation layer 13 comprises a thermally produced silicon dioxide, the latter can be used on the first and/or second main surface 3, 4 as oxide for the gates of MOS transistors. Here, as well, the thermally produced silicon dioxide affords the advantage of a highly defect-free $Si/SiO_2$ interface, thereby minimizing leakage currents in the silicon. Through the use of a thermal oxide as first insulation layer 13, the process for producing the feedthroughs through the semiconductor substrate 1 is compatible with standard CMOS processes. This makes it possible to cost-effectively equip a silicon chip or wafer with integrated circuits and with any desired number of feedthroughs.

Optionally, a barrier layer 14 may be applied to the first insulation layer 13, the barrier layer preventing the electrically conductive materials that are to be introduced into the channels 2 later from diffusing into the semiconductor substrate 1. The barrier layer 14 may be, e.g., a TiN or TaN layer applied to the surfaces of the channels 2 by vapor deposition or a CVD process. The layer thickness of the barrier layer 14 is, e.g., 100 nm. The barrier layer 14 is illustrated by a dashed line for example, only in FIG. 2C and, since it is optional, is no longer indicated in the subsequent figures.

FIG. 2D shows the substrate 200 after the channels 2 have been filled with the electrically conductive first material 9. The filling of the channels 2 with the electrically conductive first material 9 serves to provide the material required for an electrically conductive feedthrough, or at least part of the material. The electrically conductive first material 9 is optionally filled into the channels above its melting point. The electrically conductive first material 9 is chosen in particular such that it has a melting point temperature that is lower than that of the semiconductor substrate 1. One advantage of filling the channels 2 with the electrically conductive first material 9 in the liquid state may be that this process may have a higher throughput and lower process costs than conventional types of metal filling, particularly in comparison with depositions effected from the vapor phase (CVD) or electrochemical or chemical plating (electroless plating).

For example, copper (melting point: 1084° C.), silver (melting point: 962° C.) or gold (melting point: 1064° C.) can be used as electrically conductive first material 9. These materials have very good electrical conductivities and a lower melting point than silicon (melting point: 1410° C.).

Furthermore, hard solders, e.g., based on silver (e.g., AgCu28), soft solders, e.g., based on tin, and further metals, such as e.g., aluminum, lead, zinc, etc., are also conceivable. The choice of the electrically conductive first material 9 can be adapted to the desired requirements or areas of use of the substrate 200.

The filling with the electrically conductive first material 9 can be effected channel by channel or in parallel. In order to fill the channels 2, the semiconductor substrate 1 can, for example, be dipped into the melt of the electrically conductive first material 9, so that the melt can penetrate into the channels 2 essentially simultaneously.

In particular, the electrically conductive first material 9 is introduced into the channels 2 at a relative reduced pressure. The application of a relative reduced pressure makes it possible for even poorly wetting materials to be introduced into narrow channels. It holds true here that the smaller the cross-sectional area, the longer the channel and the poorer the wetting, the greater is the relative reduced pressure required for filling the channel. A relative reduced pressure in the channels 2 can be generated via an excess pressure that is exerted on the melt externally in the course of filling the electrically conductive first material 9.

On account of the section by section constriction and widening of the channels 2 as shown in FIG. 2, regions having different filling pressures are present within a channel 2. For the filling of the second section 12 (shown in FIG. 2) of the channels 2 with a metal or alloy melt, on account of its smaller second cross-sectional area 8, a filling pressure required is greater than that for the first section 11 with the larger first cross-sectional area 6.

The above described different filling behaviors of the first and second sections 11 and 12 can be utilized when filling the channels 2 with the electrically conductive first material 9. At a specific filling pressure, only the first section 11 is filled with the melt of the electrically conductive first material 9. As the pressure increasingly rises, a limit pressure is reached at which, finally, the second section 12 is also filled and the entire channel 2 is filled with melt. The state in which the entire channel 2 is filled with the melt of the electrically conductive first material 9 is undesirable, since the channel 2 would be emptied upon withdrawal from the melt. Instead, the filling pressure should be set in such a way that the first section 11 is filled with the melt, but the second section 12 is not yet filled. In this case, the second section 12 functions as a plug preventing the channel 2 from being completely filled with melt. This has the advantage that the channels 2 are not emptied when the semiconductor substrate 1 is withdrawn from the melt. By virtue of the constriction of the channels 2 in the second section 12, the channels 2 behave exactly like blind holes during filling with the electrically conductive first material 9. It is also the case for channels configured as blind holes in a semiconductor substrate that it is necessary to apply a relatively reduced pressure in order to introduce a melt into the blind holes. However, after the introduction of the melt, blind holes have to be opened to form continuous channels in order ultimately to provide an electrically conductive feedthrough through the semiconductor substrate. This process step can be obviated in the case of the procedure shown in FIG. 2.

The process step for filling the channels 2 with the electrically conductive first material 9 can be configured as follows, for example. First, the semiconductor substrate 1 is introduced into a gastight process chamber containing the melt of the electrically conductive first material 9. While the process chamber is evacuated, the semiconductor substrate 1 is situated outside the melt. Once a predetermined pressure within the range of, e.g., 0.001 to 100 mbar, and optionally of less than 1 mbar has been reached, the semiconductor substrate 1 is dipped into the melt and the process chamber subsequently pressurized. The pressure lies within the range of, e.g., 1 to 20 bar, and optionally within the range of 5 to 10 bar. The pressure required for filling the first sections 11 of the channels 2 depends in particular on the process temperature and the surface tension of the electrically conductive first material 9, in addition to the cross-sectional areas 6 and 8 of the channels 2. The semiconductor substrate 1 is drawn from the melt under the pressure set for filling the channels 2. After the solidification of the melt in the channels 2, the pressure in the process chamber is reduced to normal pressure again.

By virtue of the pressure used during the filling of the channels 2, the surface in the channels 2 need not be provided with an adhesion layer, even in the case of a poorly wetting electrically conductive first material 9. Costly additional processing steps can be obviated by the omission of adhesion layer materials in the channels 2.

Filling the channels 2 with a poorly wetting electrically conductive first material 9 under pressure may have the effect that, on the one hand, the electrically conductive first material 9 then penetrates into the channels 2 and forms there an electrically conductive feedthrough or a part thereof after solidification and, on the other hand, beads away from the two main surfaces 3 and 4 of the semiconductor substrate 1. As a result of a beading away, it is possible to avoid layer formation of the first material 9 that solidifies by cooling on the two main surfaces 3 and 4. Avoiding such layer formation on the main surfaces 3 and 4 can prevent the semiconductor substrate 1 from being exposed to such high mechanical stresses that it would be damaged in the event of the liquid electrically conductive first material 9 cooling and solidifying, on account of different coefficients of thermal expansion.

As is shown in FIG. 2E, after the first sections 11 have been filled with the electrically conductive first material 9, the second sections 12 are filled with an electrically conductive second material 15. As a result, an electrically conductive feedthrough which is composed of the electrically conductive first and second materials 9 and 15 and extends from the first main surface 3 as far as the second main surface 4 of the semiconductor substrate 1 is produced in each of the channels 2.

The electrically conductive second material 15 is filled into the channels 2 to above its melting point. The filling of the second sections 12 with the electrically conductive second material 15 is likewise effected at a relative reduced pressure. The process steps described above in connection with filling the first sections 11 can be carried out in a corresponding manner when filling the second sections 12. In this case, it should be taken into consideration that a higher filling pressure must be set on account of the smaller second cross-sectional area 8 in the second sections 12.

In particular, metals and alloys are suitable for the electrically conductive second material 15. The electrically conductive second material 15 is chosen in particular such that it has a melting point temperature that is lower than that of the electrically conductive first material 9. This makes it possible to prevent the electrically conductive first material 9 from melting as a result of excessively great heating during the filling of the electrically conductive second material 15 into the second sections 12. The electrically conductive second material 15 is chosen in particular in such a way that it does not form a eutectic or alloy having a lower melting point with the electrically conductive first material 9. In principle, the metals, alloys, hard and soft solders that were mentioned above for the electrically conductive first material 9 are suitable for the electrically conductive second material 15. For example, the following combination shall be mentioned: e.g., AgCu (melting point: approximately 780° C.) is used for the electrically conductive first material 9 and, e.g., SnAgCu (melting point: approximately 250° C.) is used for the electrically conductive second material 15.

During the process steps shown in FIG. 2, the semiconductor substrate 1 may be part of a semiconductor wafer. This makes it possible to produce the electrically conductive feedthroughs for a plurality of semiconductor chips simultaneously. It is only in a later process step that the semiconductor wafer is subdivided into a plurality of semiconductor chips, e.g., by sawing.

Before or after the production of the feedthroughs comprising the two electrically conductive materials 9 and 15, integrated components can be supplied to the semiconductor substrate 1. It is possible to carry out process steps via which transistors, diodes or other circuit elements or sensor elements or micromechanical elements are integrated on the semiconductor substrate 1.

Alternatively, or in addition, further substrates with or without integrated circuits can be supplied to the substrate 200. A high packing density can be obtained in this way.

Figure 3A:
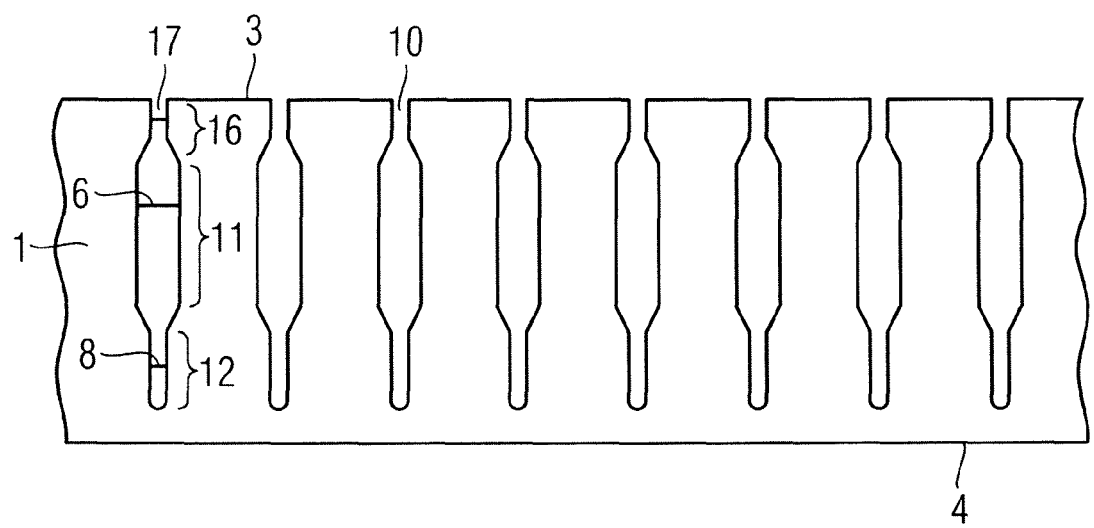
FIGS. 3A to 3D schematically show a substrate 300 and a method for producing the substrate 300.
Figure 3B:
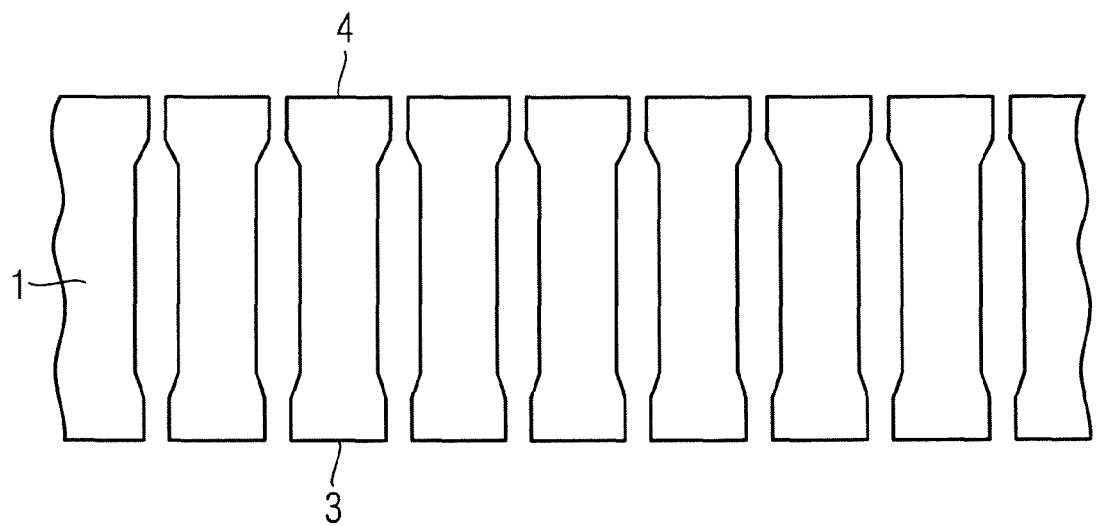
Figure 3C:
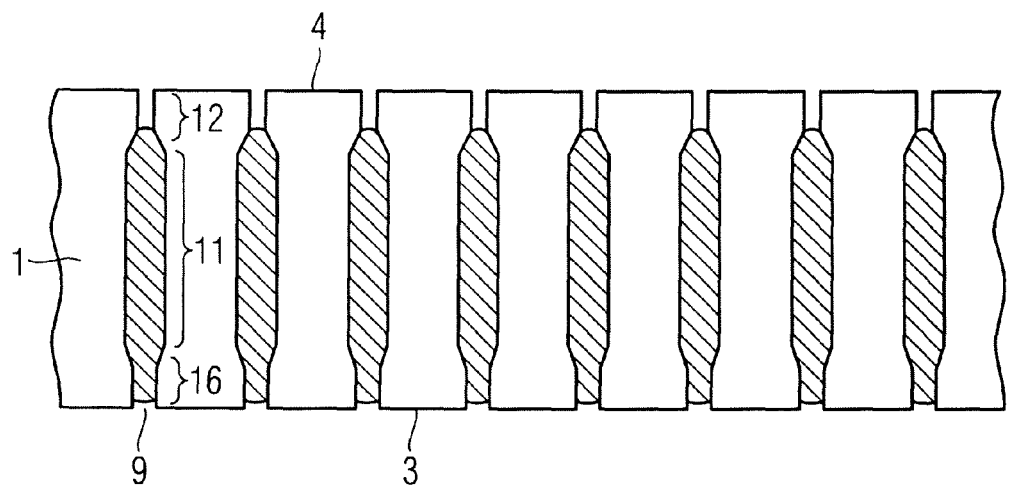
Figure 3D:
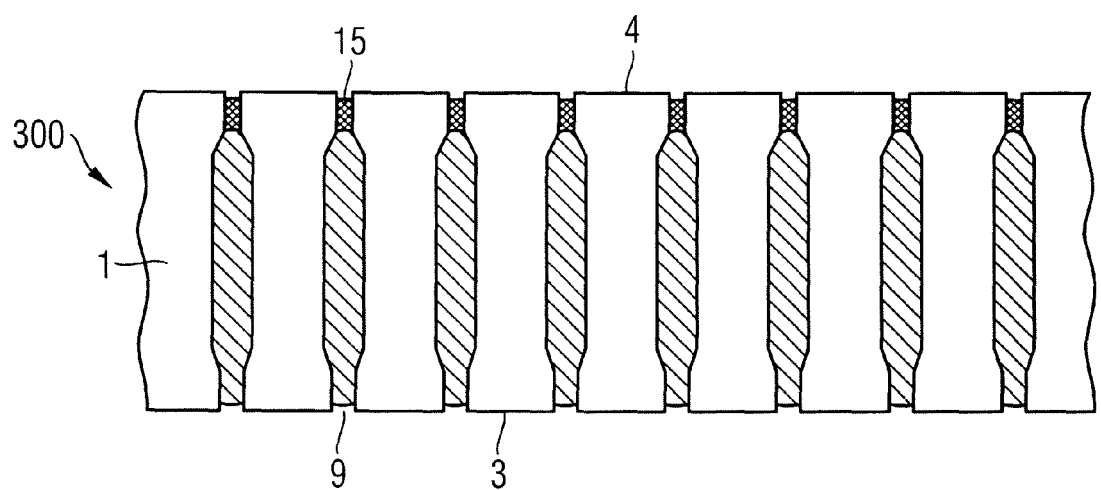

FIG. 3D schematically illustrates the substrate 300 as a further exemplary embodiment. FIGS. 3A to 3D show steps for producing the substrate 300. The substrate 300 and the production thereof essentially correspond to the substrate 200 shown in FIG. 2 and the production thereof. In contrast to the substrate 200, however, the channels 2 of the substrate 300 comprise not only first and second sections 11 and 12 but furthermore in each case a third section 16 having a third cross-sectional area 17. The third cross-sectional area 17 may be different from the first and second cross-sectional areas 6 and 8 of the first and second sections 11 and 12. In this case, the third cross-sectional area 17 is in particular larger than the second cross-sectional area 8, but smaller than the first cross-sectional area 6. If the above described electrochemical etching is employed for producing the blind holes 10, the etching current for producing the third sections 17 is varied correspondingly.

The filling of the channels 2 of the substrate 300 with the electrically conductive first material 9 is effected at a relatively reduced pressure as described above. In this case, the pressure in the process chamber is set such that the melt of the electrically conductive first material 9 penetrates into the channels 2 from the first main surface 3 of the semiconductor substrate 1, the first main surface being adjoined by the third sections 16, and the second sections 12 are not filled with the melt (cf., FIG. 3C). The pressure when filling the channels 2 with the electrically conductive first material 9 must accordingly be set in such a way that the limit pressure for filling the third sections 16 is already exceeded, but the limit pressure for filling the second sections 12 is not yet reached.

One advantage of the substrate 300 over the substrate 200 is that the electrically conductive first material 9 can be melted once again after introduction into the channels 2. If the channels 2 were subdivided into only two sections as in the case of the substrate 200, melting of the electrically conductive first material 9 in the channels 2 would result in the melt running out from the channels 2. On account of the constrictions of the channels 2 in the substrate 300 towards both main surfaces 3 and 4, the electrically conductive first material 9 cannot emerge from the channels 2 in the event of renewed melting. Such melting of the electrically conductive first material 9 may occur in various process steps in which a temperature above the melting point of the electrically conductive first material 9 prevails.

Figure 4A:
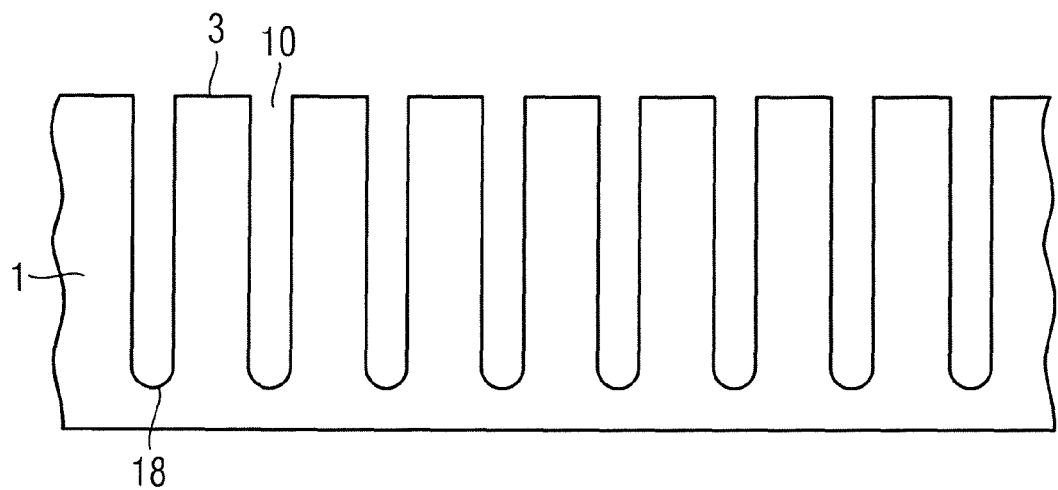
FIGS. 4A to 4D schematically show a substrate 400 and a method for producing the substrate 400.
Figure 4B:
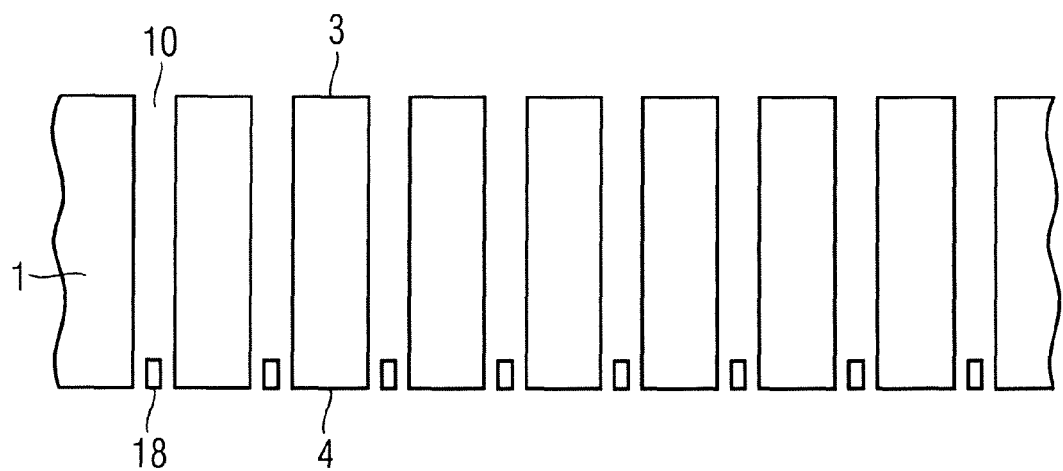
Figure 4C:
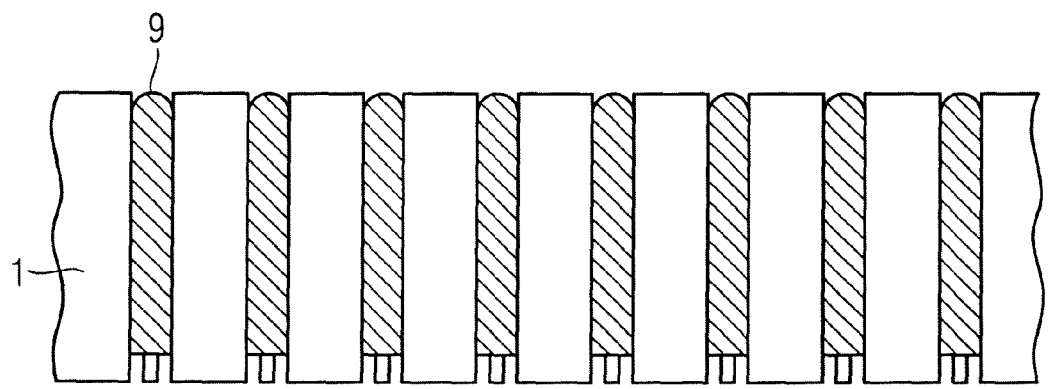
Figure 4D:
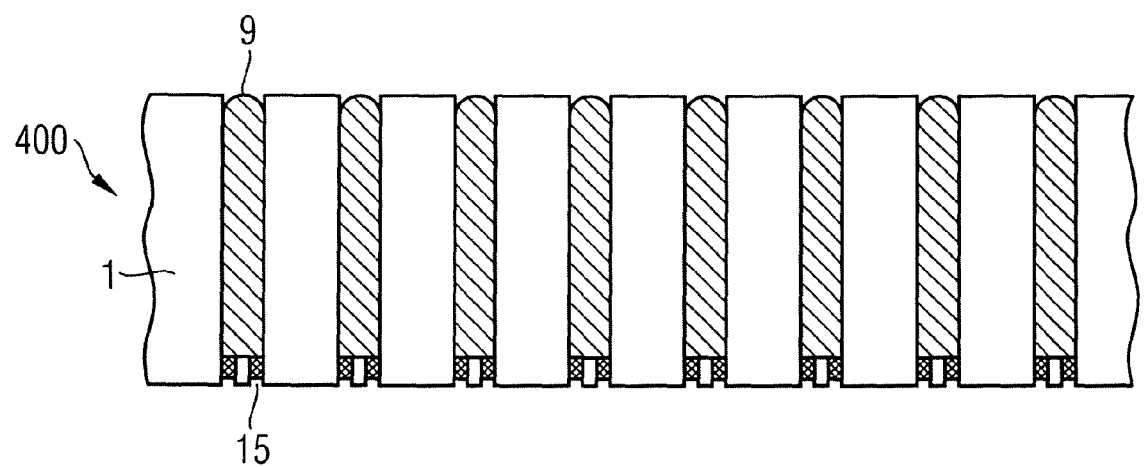

FIG. 4D schematically illustrates the substrate 400 as a further exemplary embodiment. FIGS. 4A to 4D show steps for producing the substrate 400. In contrast to the substrates 200 and 300, in the case of the substrate 400 no blind holes 10 comprising varying cross sections are introduced into the semiconductor substrate 1. Rather, the blind holes 10 have a constant cross-sectional area. Only the tip 18 of the blind holes 10 is tapered. The tapering of the tip 18 may be due to production; for example, such a tapering results during an etching process or due to drilling, and can be utilized for the production of the substrate 400. After the blind holes 10 have been produced, they are opened by material removal from the second main surface 4. As shown in FIG. 4B, in this case the amount of semiconductor material removed on the second main surface 4 is only as much as until the tips 18 of the blind holes 10 are reached. Since the tips 18 are tapered, a section having a smaller cross-sectional area results in the region of the tips 18. This smaller cross-sectional area can be utilized, in the same way as in the case of the substrate 200, as a pressure-dependent barrier during the filling of the channels 2 with the electrically conductive first material 9 (cf., FIG. 4C).

The opening of the blind holes 10 from the second main surface 4 can be carried out, for example, via a CVD process and possibly a previous lithographic patterning. Alternatively, the semiconductor material on the second main surface 4 can also be ground away mechanically until the tips 18 of the blind holes 10 are reached.

Since it is not necessary to vary the cross-sectional area of the blind holes 10 during production of the substrate 400, besides electrochemical etching it is also possible to employ techniques for creating the blind holes 10 which would permit no cross-sectional area variation apart from the tapering in the tip 18 of the blind hole 10. Besides etching techniques, alternate techniques include, e.g., mechanical drilling, sandblasting, ultrasonic drilling and laser drilling.

As is shown in FIG. 4D, the uncovered tips 18 of the blind holes 10 can be filled with the electrically conductive second material 15 in the same way as in the case of the substrate 200.

Figure 5A:
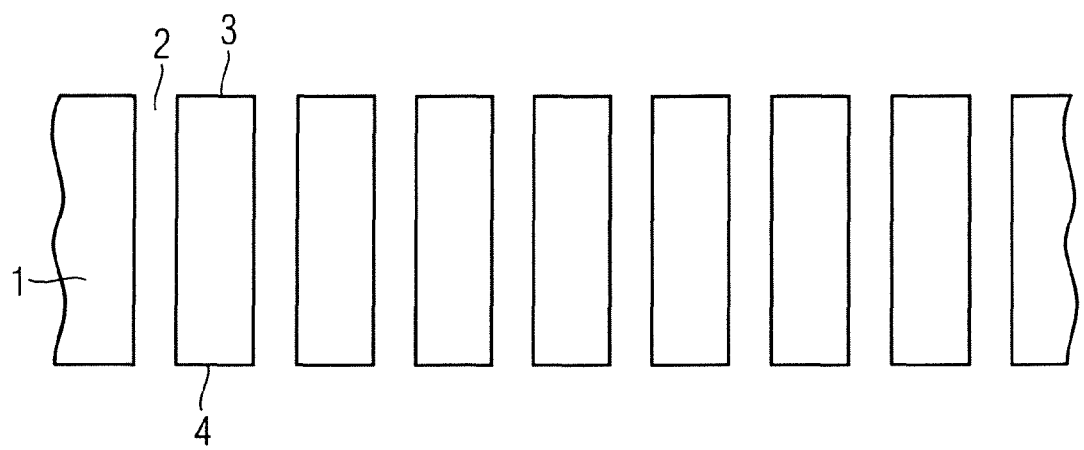
FIGS. 5A to 5D schematically show a substrate 500 and a method for producing the substrate 500.
Figure 5B:
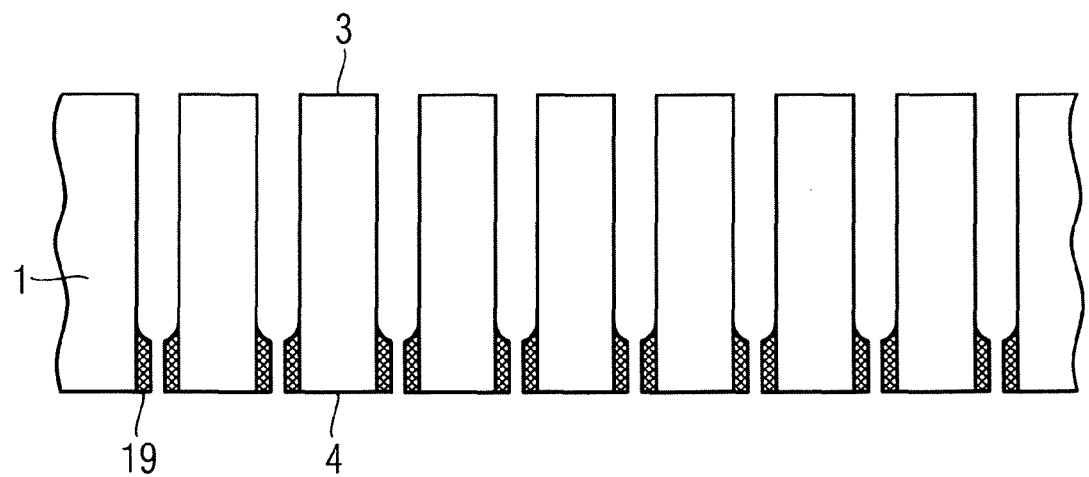
Figure 5C:
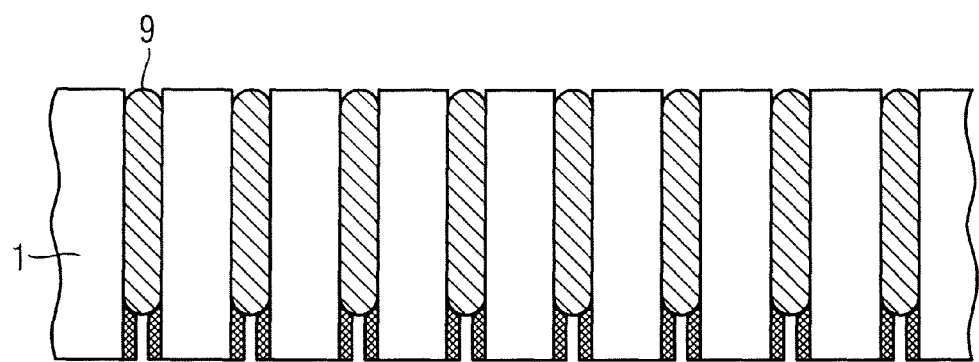
Figure 5D:
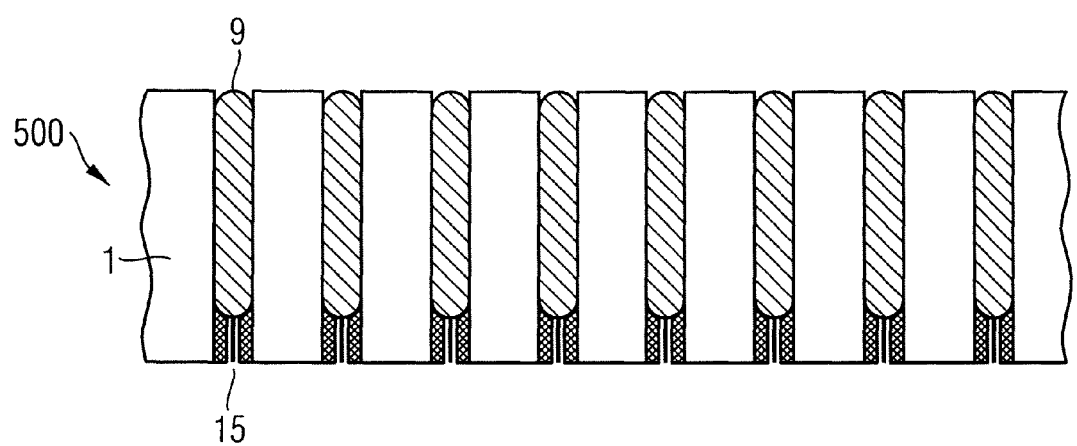

FIG. 5D schematically illustrates the substrate 500 as a further exemplary embodiment. FIGS. 5A to 5D show steps for producing the substrate 500. As is shown in FIG. 5A, in order to produce the substrate 500, uniform channels 2 without variation of their cross-sectional area are introduced into the semiconductor substrate 1. The channels can be produced, for example, by drilling, stamping, etching or other techniques. An insulating material 19, e.g., $SiO_2$ or $Si_3N_4$, is subsequently deposited on the second main surface 4 of the semiconductor substrate 1. This can be effected for example via sputtering or a CVD process. During the deposition of the insulating material 19, the insulating material 19 deposits not only on the second main surface 4 but also in the edge region with respect to the second main surface 4 on the surfaces of the channels 2 and produces a constriction of the channels 2 in the edge region with respect to the second main surface 4. As is shown in FIGS. 5C and 5D, the constriction again can be utilized as a pressure-dependent barrier during the filling of the channels 2 with the electrically conductive first material 9. In the present case, e.g., microchannel glass or partially oxidized silicon may also be used as starting substrate 1.

Figure 6A:
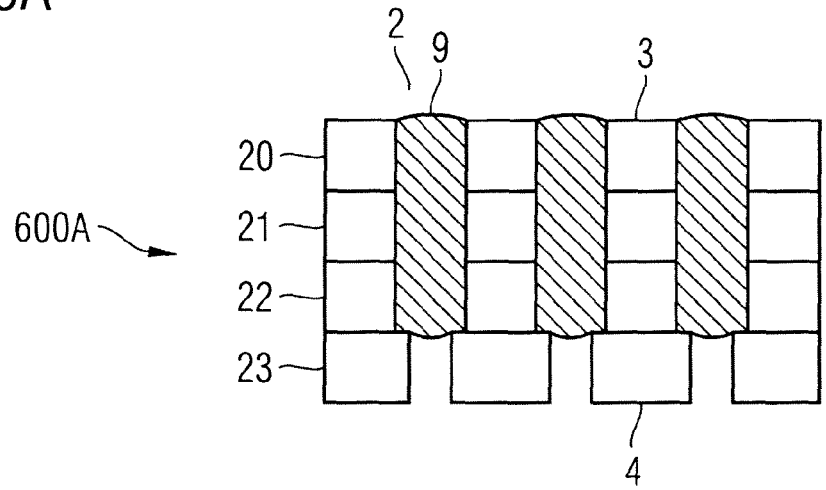
FIGS. 6A to 6C schematically show substrates 600A, 600B and 600C.
Figure 6B:
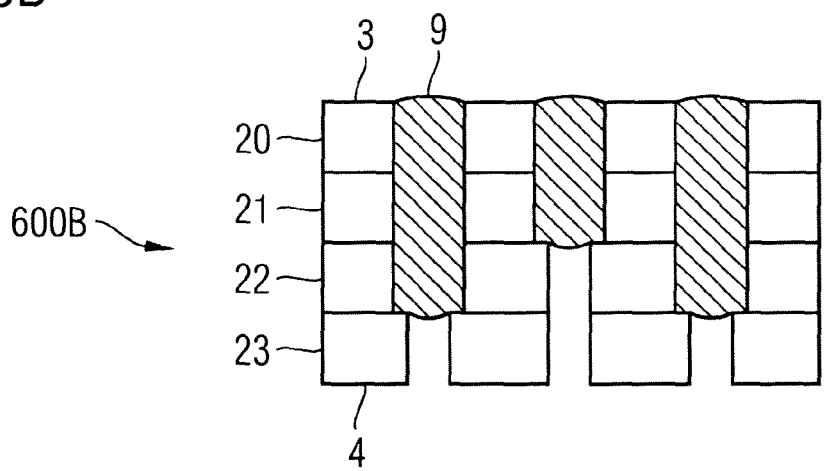
Figure 6C:
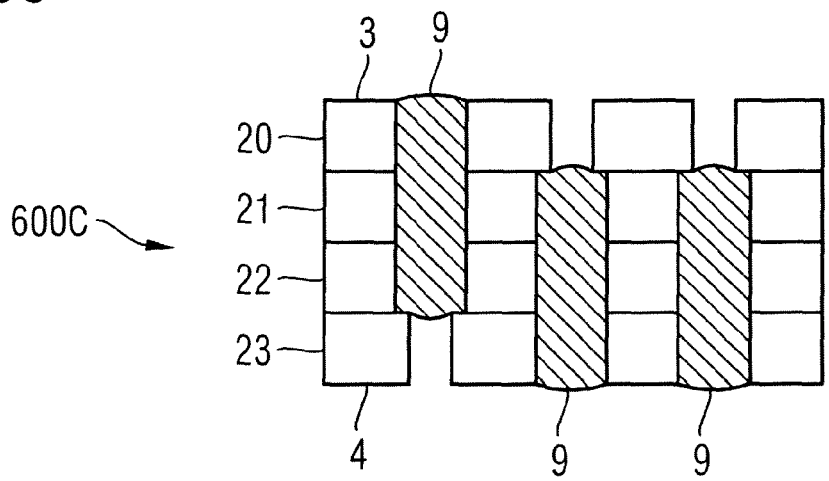

FIGS. 6A, 6B and 6C schematically illustrate the substrates 600A, 600B and 600C as further exemplary embodiments. The substrates 600A to 600C comprise stacks of semiconductor substrate layers 20 to 23. In the individual semiconductor substrate layers 20 to 23, channels have been produced, e.g., by etching, drilling, stamping or other techniques, and the semiconductor substrate layers 20 to 23 have been stacked one above another in such a way that their respective channels lie one above another and produce channels extending from the first main surface 3 through the stack towards the second main surface 4.

In this case, it may be provided that the channels in the semiconductor substrate layers 20 to 23 have different cross-sectional areas. For example, in the case of the substrate 600A, the cross-sectional area of the channels in the semiconductor substrate layer 23 is smaller than that in the rest of the semiconductor substrate layers 20 to 22. As a result, a constriction of the channels 2 extending through the stack is produced towards the main surface 4 and can be used as a pressure-dependent barrier during the filling of the channels 2 with the electrically conductive first material 9.

Furthermore, as in the case of the substrate 600B, a semiconductor substrate layer 22 can have different cross-sectional areas. In the example shown in FIG. 6B, this has the effect that the central channel 2 is filled with the electrically conductive first material 9 only as far as the semiconductor substrate layer 21.

Furthermore, as in the case of the substrate 600C, it may be provided that the constriction of the channels 2 is arranged either on the side of the first main surface 3 (central and right-hand channels in FIG. 6C), or on the side of the second main surface 4 (left-hand channel in FIG. 6C). Accordingly, the channels 2 are filled with the electrically conductive first material 9 either from the first main surface 3 (left-hand channel in FIG. 6C) or from the second main surface 4 (central and right-hand channels in FIG. 6C).

The fixing of the semiconductor substrate layers 20 to 23 among one another can be effected, for example, by adhesive bonding, diffusion soldering or other techniques.

The filling of the constricted regions of the channels 2 with the electrically conductive second material 15 is not illustrated in FIGS. 6A to 6C. This can be effected in a manner corresponding to that in the case of the substrate 200.

Figure 7:
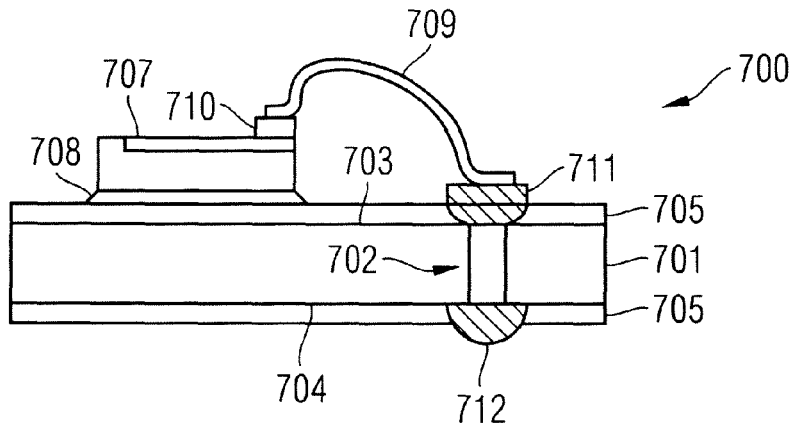
FIG. 7 schematically shows a semiconductor module 700.

FIG. 7 schematically shows a semiconductor module 700 including a substrate 701 having a feedthrough 702 extending from the first main surface 703 to the second main surface 704. The feedthrough 702 has been produced by one of the methods described above, for example, as in the case of the substrate 200 shown in FIGS. 2A to 2E (the constriction of the channel and of the feedthrough 702 is not illustrated in FIG. 7). The substrate 701 is, for example, a silicon chip and the insulation layers 705 applied to the first and second main surfaces 703, 704 of the substrate 701 are an oxide.

The rear side of an integrated semiconductor component 706 having an integrated circuit 707 on the front side has been adhesively bonded on to the oxide layer 705 via an adhesive 708. The semiconductor component 706 is electrically connected to the substrate 701 via a bonding wire 709 leading from a bonding contact location 710 of the semiconductor component 706 to a bonding contact location 711 of the substrate 701. In the present case, the bonding contact location 711 of the substrate 701 has been applied directly to the feedthrough 702 of the substrate 701. Thereby, the bonding wire 709 is directly connected to an external contact 712, e.g., a solder ball 712.

The contact-connection of the bonding contact location 711 to the feedthrough 702 is effected in a manner that is well known to one of ordinary skill in the art: first, the oxide layer 705 on the first main surface 703 has to be opened at the location of the feedthrough 702. This may be effected via selectively etching with respect to a photolithographically produced mask (not shown). Thereafter, a metal layer (e.g., aluminum) is applied to the oxide layer 705 and patterned photolithographically in such a way that a layer element 711, that is large enough for a wire connection 711, remains.

The contact-connection of the solder ball 712 is effected analogously in a manner known to one of ordinary skill in the art: first, the oxide layer 705 on the second main surface 704 has to be opened at the location of the feedthrough 702. This may be effected via selectively etching with respect to a photolithographically produced mask (not shown). Thereafter, the second main surface 704 is brought into contact with a copper solder melt, so that the copper solder wets the surface of the feedthrough 702. A ball-type solder ball 712 remains after cooling.

Figure 8:
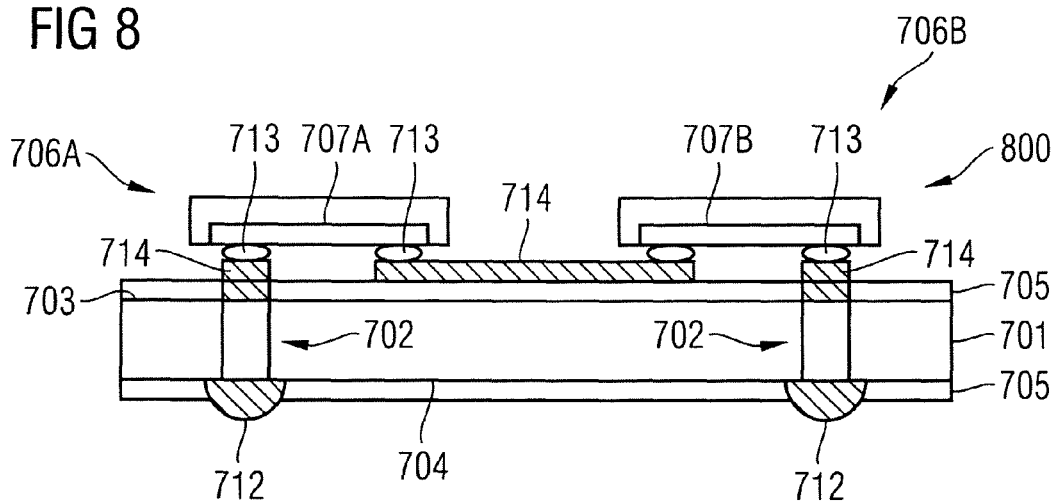
FIG. 8 schematically shows a semiconductor module 800.

FIG. 8 schematically shows a further semiconductor module 800 with a substrate 701, including two feedthroughs 702 from the first main surface 703 to the second main surface 704. The semiconductor module 800 is constructed like that of FIG. 7. However, in contrast to FIG. 7, the present semiconductor module 800 comprises two integrated components 706A, 706B which have been applied to the substrate 701 by their front sides, i.e., by the side including the integrated circuits 707A, 707B. In this case, the electrical connection to the substrate 701 is not effected via bonding wires but rather via solder ball contacts 713 which connect the bonding contact locations of the integrated components 706A, 706B to interconnects 714 applied on the substrate 701. This bonding method is also known by the term "flip-chip bonding" and will not be explained any further here.

As can be gathered from FIG. 8, some interconnects 714 run directly over feedthroughs 702 and are electrically conductively connected to the latter. In this way, it is possible to lead bonding contact locations of the integrated components 706A, 706B via the feedthroughs 702 directly to one of the external contacts 712. This saves long interconnects and improves signal transmission, particularly at high frequencies.

It can be gathered from FIG. 8, furthermore, that some interconnects 714 run in such a way that they connect the bonding contact locations of one integrated component 706A to those of the other integrated component 706B. In this way, different integrated circuits 706A, 706B can be connected to one another without requiring further external contacts 712. Integrated circuits can thus be packed even more densely.

It should be pointed out that the embodiments of FIGS. 7 and 8 have silicon wafers or silicon chips as substrate 701.

This has the advantage that the coefficient of thermal expansion (CTE) of the substrate 702 is the same as that of the integrated circuits, which are usually likewise produced on a silicon basis. This helps to reduce mechanical stresses between the substrate 702 and the integrated component 706. Furthermore, in comparison with, for example, a ceramic, silicon has a good thermal conductivity in order to effectively dissipate the heat generated by the integrated circuits. Furthermore, the etching of blind holes in an electrochemical manner can be carried out particularly effectively using silicon.

Figure 9:
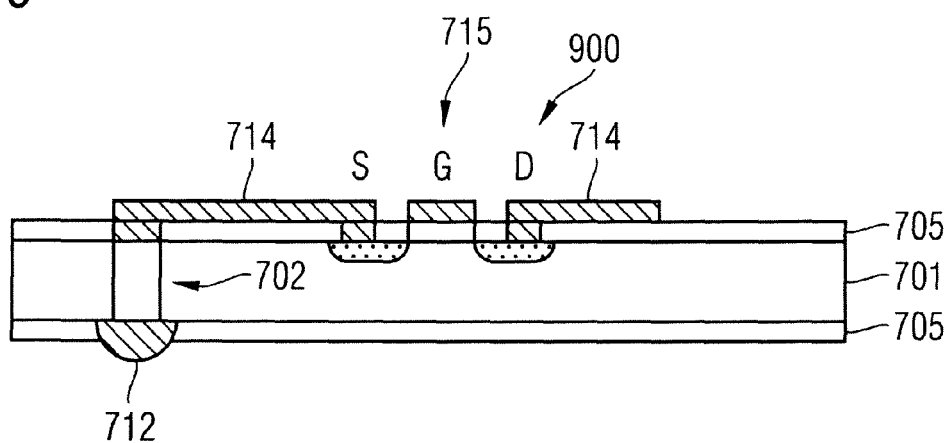
FIG. 9 schematically shows a semiconductor module 900.

FIG. 9 schematically shows a further semiconductor module 900 with a substrate 701 comprising a feedthrough 702 extending from the first main surface 703 to the second main surface 704. The semiconductor module 900 is constructed like that from FIG. 7. However, in contrast to FIG. 7, the integrated circuit 707 is integrated into the substrate 701. FIG. 9 shows a transistor 715 for example. Source S and drain D of the transistor 715 are produced by dopings of the monocrystalline silicon substrate 701, while the gate G is produced by thermal oxidation, which arose, for example, during the production of the insulation layer 705. FIG. 9 furthermore shows interconnects 714 which connect the source S to the feedthrough 702 and/or respectively make contact with the gate G and the drain D. In this way, the feedthrough 702 enables short connecting links of the active and passive components of the integrated circuits (e.g., resistors, transistors, diodes, coils, capacitors, etc.) to the external connections, thereby obviating long interconnections and hence the need for multiple interconnect planes.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method of manufacturing a substrate, the method comprising:
    forming at least one channel extending from a first main surface to a second main surface of a substrate, the at least one channel comprising a first cross-sectional area disposed at a first location and a second cross-sectional area disposed at a second location, wherein the first cross-sectional area is larger than the second cross-sectional area; and
    arranging an electrically conductive first material in the at least one channel by dipping the substrate in a first melt of electrically conductive first material and applying a pressure to the first melt such that the at least one channel is filled with the first melt at the first location but is free of the first melt at the second location, wherein the at least one channel has a first opening at the first main surface of the substrate and a second opening at the second main surface of the substrate, and wherein the first opening and the second opening are exposed to the first melt of electrically conductive first material when the substrate is dipped in the first melt.

2. The method according to claim 1, wherein the at least one channel is formed via electrochemical etching of the substrate.

3. The method according to claim 2, wherein the first cross-sectional area and the second cross-sectional area are formed via different etching parameters.

4. The method according to claim 3, wherein the first cross-sectional area and the second cross-sectional area are formed via different etching currents that flow through the substrate during the electrochemical etching.

5. The method according to claim 1, wherein forming the at least one channel comprises:
    producing a blind hole with a narrowing end region on the first main surface of the substrate; and
    removing substrate material on the second main surface of the substrate to the extent of the narrowing end region of the blind hole.

6. The method according to claim 1, further comprising:
    producing a first insulation layer on the first and second main surfaces of the substrate and on a surface of the at least one channel.

7. The method according to claim 6, wherein the first insulation layer is produced by heating.

8. The method according to claim 6, wherein the first insulation layer is produced by deposition of an insulating first material.

9. The method according to claim 1, wherein producing the at least one channel comprises:
    producing a passage hole in the substrate; and
    depositing an insulating material on a surface of the passage hole in a region adjoining one of the main surfaces of the substrate.

10. The method according to claim 1, further comprising: arranging an electrically conductive second material in the at least one channel, subsequent to arranging the electrically conductive first material in the at least one channel.

11. The method according to claim 1, wherein the at least one channel is formed with a third cross-sectional area at a third location.

12. The method according to claim 2, wherein the electrically conductive first material is arranged, in the at least one channel, in the liquid state, the method further comprising:
    solidifying the electrically conductive first material; and
    subsequently re-melting the electrically conductive first material.

13. The method according to claim 10, wherein the step of arranging an electrically conductive second material in the at least one channel comprises dipping the substrate in a second melt of the electrically conductive second material and applying a pressure to the second melt such that the at least one channel is filled with the second melt of the electrically conductive second material at the second location.

14. The method according to claim 13, wherein a melting point of the electrically conductive second material is lower than a melting point of the electrically conductive first material.

15. A method of manufacturing a substrate, the method comprising:
    forming at least one channel extending from a first main surface to a second main surface of a substrate, the at least one channel comprising a first cross-sectional area disposed at a first location and a second cross-sectional area disposed at a second location, wherein the first cross-sectional area is larger than the second cross-sectional area;
    arranging an electrically conductive first material in the at least one channel by dipping the substrate in a first melt of electrically conductive first material and applying pressure to the first melt such that the at least one channel is filled with the first melt at the first location but is free of the first melt at the second location; and
    arranging an electrically conductive second material in the at least one channel subsequent to arranging the electrically conductive first material in the at least one channel, wherein the step of arranging an electrically conductive second material in the at least one channel comprises dipping the substrate in a second melt of the electrically conductive second material and applying pressure to the second melt such that the at least one channel is filled with the second melt at the second location.

16. The method according to claim 15, wherein the at least one channel is formed via electrochemical etching of the substrate.

17. The method according to claim 16, wherein the first cross-sectional area and the second cross-sectional area are formed via different etching parameters.

18. The method according to claim 17, wherein the first cross-sectional area and the second cross-sectional area are formed via different etching currents that flow through the substrate during the electrochemical etching.

19. The method according to claim 15, wherein forming the at least one channel comprises:
    producing a blind hole with a narrowing end region on the first main surface of the substrate; and
    removing substrate material on the second main surface of the substrate to the extent of the narrowing end region of the blind hole.

20. The method according to claim 15, further comprising: producing a first insulation layer on the first and second main surfaces of the substrate and on a surface of the at least one channel.

21. The method according to claim 20, wherein the first insulation layer is produced by heating.

22. The method according to claim 20, wherein the first insulation layer is produced by deposition of an insulating first material.

23. The method according to claim 15, wherein producing the at least one channel comprises:
    producing a passage hole in the substrate; and
    depositing an insulating material on the passage hole in a region adjoining one of the main surfaces of the substrate.

24. The method according to claim 15, wherein a melting point of the electrically conductive second material is lower than a melting point of the electrically conductive first material.

* * * * *

UNITED STATES PATENT AND TRADEMARK OFFICE
CERTIFICATE OF CORRECTION

PATENT NO.        : 8,048,801 B2                          Page 1 of 1
APPLICATION NO.   : 11/751396
DATED             : November 1, 2011
INVENTOR(S)       : Stephan Dertinger It is certified that error appears in the above-identified patent and that said Letters Patent is hereby corrected as shown below:

Column 14, line 34, replace "claim 2" with -- claim 11 --.

Signed and Sealed this
Twenty-third Day of October, 2012

David J. Kappos
*Director of the United States Patent and Trademark Office*